United States Patent
Nandagopal et al.

(10) Patent No.: US 12,368,118 B2
(45) Date of Patent: Jul. 22, 2025

(54) INTEGRATED MILLIMETER-WAVE DUAL-MODE MATCHING NETWORK

(71) Applicant: NXP B.V., Eindhoven (NL)

(72) Inventors: Harish Nandagopal, Veldhoven (NL); Stephane Damien Thuriés, Saubens (FR); Didier Salle, Toulouse (FR)

(73) Assignee: NXP B.V., Eindhoven (NL)

( * ) Notice: Subject to any disclaimer, the term of this patent is extended or adjusted under 35 U.S.C. 154(b) by 725 days.

(21) Appl. No.: 17/658,450

(22) Filed: Apr. 8, 2022

(65) Prior Publication Data
US 2022/0344288 A1    Oct. 27, 2022

(30) Foreign Application Priority Data
Apr. 22, 2021 (EP) .................................... 21305530

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4846* (2013.01); *H01L 23/49838* (2013.01);
(Continued)

(58) Field of Classification Search
CPC ............. H01L 23/66; H01L 2223/6616; H01L 2223/6638; H01L 21/4846;
(Continued)

(56) References Cited

U.S. PATENT DOCUMENTS 6,531,943 B2    3/2003    Niu et al.
7,383,058 B2    6/2008    Franca-Neto
(Continued)

FOREIGN PATENT DOCUMENTS

EP    2387295 A1    11/2011

OTHER PUBLICATIONS

Zheng, Z., "Design of a Compact Wideband Balun between Microstrip and Coplanar Stripline", 2012 IEEE MTT-S Microwave Workshop Series on Millimeter Wave Wireless Technology and Applications, Sep. 18-20, 2012, 3 pages.
(Continued)

*Primary Examiner* — Thanh Y. Tran

(57) ABSTRACT

An integrated circuit device includes an integrated circuit device die and a substrate. The integrated circuit device die includes a plurality of first contact pads. The first contact pads include a pair of first signal contact pads configured to provide a differential signal port of the integrated circuit device die. The differential signal port is configured to operate at a predetermined frequency. The substrate includes a plurality of second contact pads on a first surface of the substrate. The second contact pads are configured to be soldered to a printed circuit board, and include a pair of second signal contact pads. The integrated circuit device die is affixed to a second surface of the substrate via the first contact pads. The substrate includes a pair of circuit paths that each couple one of the first signal contact pads to an associated one of the second signal contact pads. The pair of circuit paths each have a length to provide a half-wave matching network at the predetermined frequency to match a single-ended signal at the pair of second signal pads to the differential signal port.

20 Claims, 3 Drawing Sheets

(51) Int. Cl.
*H01L 23/498* (2006.01)
*H03H 7/38* (2006.01)

(52) U.S. Cl.
CPC ....... *H03H 7/38* (2013.01); *H01L 2223/6616* (2013.01); *H01L 2223/6638* (2013.01)

(58) Field of Classification Search
CPC .. H01L 23/49838; H03H 7/38; H05K 1/0251; H05K 1/113; H05K 1/0243; H05K 3/3436; H05K 1/0245; H01P 5/028
See application file for complete search history.

(56) References Cited

U.S. PATENT DOCUMENTS

| | | |
|---|---|---|
| 8,174,336 B2 | 5/2012 | Kim et al. |
| 8,487,430 B1 | 7/2013 | Walworth |
| 9,576,915 B2 | 2/2017 | Huang et al. |
| 2002/0153984 A1 | 10/2002 | Niu et al. |
| 2012/0074512 A1 | 3/2012 | Ono et al. |
| 2015/0061091 A1 | 3/2015 | Seler et al. |
| 2016/0190673 A1 | 6/2016 | Huang et al. |
| 2017/0263570 A1* | 9/2017 | Lin ..................... H01L 24/16 |
| 2021/0143111 A1* | 5/2021 | Aleksov ............... H01L 23/053 |

OTHER PUBLICATIONS

Qian, Yongxi et al.; "A Broadband Uniplanar Microstrip-to-CPS Transition"; Proceedings of 1997 Asia Pacific Microwave Conference, Dec. 2-5, 1997, Hong Kong, China; DOI: 10.1109/APMC.1997.654615.

* cited by examiner

Differential Signal On PCB
300

Single-Ended Signal On PCB
305

INTEGRATED MILLIMETER-WAVE DUAL-MODE MATCHING NETWORK

CROSS-REFERENCE TO RELATED APPLICATIONS

This application claims the priority under 35 U.S.C. § 119 of European Patent application no. 21305530.4, filed on 22 Apr. 2021, the contents of which are incorporated by reference herein.

FIELD OF THE DISCLOSURE

This disclosure generally relates to millimeter-wave systems and more particularly relates to an integrated millimeter-wave dual-mode matching network on a millimeter-wave device.

BACKGROUND

Millimeter-wave systems, electronic systems that operate in the 30 to 300 gigahertz (GHz) frequency band, are utilized in a wide variety of applications including cellular communications (e.g., 5G networks), radio astronomy, military and civilian radar systems, security scanners, and medical imaging. The routing of millimeter-wave signals in a millimeter-wave system present unique challenges in the design and manufacturability of the system. Single-ended signals, that is, signals that are provided on a single signal trace and where the signal is provided with reference to a ground plane of the millimeter-wave system, are typically simpler to design and manufacture, but also typically have poorer performance characteristics as compared with balanced signals that are provided on two traces where the signal is carried as a differential signal between the traces. Millimeter-wave integrated circuits typically provide balanced signal inputs and outputs, and so, millimeter-wave systems that utilize single-ended signal routing also need a mechanism to convert the single-ended signals on the system to balanced signals for the integrated circuits. As such, a millimeter-wave system that utilizes single-ended routing will typically employ baluns, a transformer device, to perform the conversion and matching. However, baluns are bulky and consume a great deal of space on a printed circuit board (PCB). The use of baluns may be undesirable for certain types of millimeter-wave systems, such as cellphones and automotive radars, where space on a PCB is limited.

SUMMARY

According to a first aspect of the present disclosure, there is provided an integrated circuit device, comprising: an integrated circuit device die having a plurality of first contact pads, the plurality of first contact pads including a pair of first signal contact pads configured to provide a differential signal port of the integrated circuit device die, the differential signal port configured to operate at a predetermined frequency; and a substrate having a plurality of second contact pads on a first surface of the substrate, the second contact pads configured to be soldered to a printed circuit board, the plurality of second contact pads including a pair of second signal contact pads, wherein the integrated circuit device die is affixed to a second surface of the substrate via the first contact pads, wherein the substrate includes a pair of circuit paths, each circuit path configured to couple one of the first signal contact pads to an associated one of the second signal contact pads, and wherein the pair of circuit paths is further configured to provide a half-wave matching network at the predetermined frequency to match a single-ended signal at the pair of second signal pads to the differential signal port.

Each circuit path may include a first circuit trace on a first metallization layer on the second surface of the substrate.

Each circuit may path further include a via coupling the first circuit trace on the second surface of the substrate to the associated second contact pad on the first surface of the substrate.

The length may include a sum of a trace length of the first circuit trace and a via length of the via.

Each circuit path may further include a second circuit trace on a second metallization layer laminated within the substrate.

The predetermined frequency may be a millimeter-wave frequency in a range of 30 GHz to 300 GHz.

The length may be in a range between 2.9 millimeters and 172 millimeters.

The integrated circuit device may be one of a flip-chip device, an embedded wafer level packaging (eWLB) device, and a fan out wafer level packaging (FOWLP) device.

According to a second aspect of the present disclosure, there is provided a method, comprising: providing, on an integrated circuit device die of an integrated circuit device, a plurality of first contact pads, the plurality of first contact pads including a pair of first signal contact pads configured to provide a differential signal port of the integrated circuit device die, the differential signal port configured to operate at a predetermined frequency; providing, on a substrate of the integrated circuit device, a plurality of second contact pads on a first surface of the substrate, the second contact pads configured to be soldered to a printed circuit board, the plurality of second contact pads including a pair of second signal contact pads; affixing the integrated circuit device die to a second surface of the substrate via the first contact pads; and providing, on the substrate, a pair of circuit paths, each circuit path configured to couple one of the first signal contact pads to an associated one of the second signal contact pads, wherein the pair of circuit paths is further configured to provide a half-wave matching network at the predetermined frequency to match a single-ended signal at the pair of second signal pads to the differential signal port.

The method may further comprise: providing, in each circuit path, a first circuit trace on a first metallization layer on the second surface of the substrate.

The method may further comprise: providing, in each circuit path, a via coupling the first circuit trace on the second surface of the substrate to the associated second contact pad on the first surface of the substrate.

The method may further comprise: including a sum of a trace length of the first circuit trace and a via length of the via in the length The method may further comprise: providing, in each circuit path further, a second circuit trace on a second metallization layer laminated within the substrate.

The predetermined frequency may be a millimeter-wave frequency in a range of 30 GHz to 300 GHz.

The length may be in a range between 2.9 millimeters and 172 millimeters.

The integrated circuit device may be one of a flip-chip device, an embedded wafer level packaging (eWLB) device, and a fan out wafer level packaging (FOWLP) device.

According to a third aspect of the present disclosure, there is provided a millimeter-wave system, comprising: a printed circuit board having a plurality of first contact pads, the plurality of first contact pads including a pair of first signal contact pads to provide a single-ended signal; an integrated circuit device die having a plurality of second contact pads, the plurality of second contact pads including a pair of second signal contact pads configured to provide a differential signal port of the integrated circuit device die, the differential signal port configured to operate at a predetermined frequency; and a substrate having a plurality of third contact pads on a first surface of the substrate, the third contact pads configured to be soldered to the printed circuit board, the plurality of second contact pads including a pair of second signal contact pads; wherein the integrated circuit device die is affixed to a second surface of the substrate via the first contact pads; wherein the substrate includes a pair of circuit paths, each circuit path configured to couple one of the second signal contact pads to an associated one of the third signal contact pads; and wherein the pair of circuit paths is further configured to provide a half-wave matching network at the predetermined frequency to match the single-ended signal at the pair of second signal pads to the differential signal port.

Each circuit path may include a first circuit trace on a first metallization layer on the second surface of the substrate and a via coupling the first circuit trace on the second surface of the substrate to the associated second contact pad on the first surface of the substrate, and the length may include a sum of a trace length of the first circuit trace and a via length of the via.

The predetermined frequency may be a millimeter-wave frequency in a range of 30 GHz to 300 GHz, and the length is in a range between 2.9 millimeters and 172 millimeters.

The integrated circuit device may be one of a flip-chip device, an embedded wafer level packaging (eWLB) device, and a fan out wafer level packaging (FOWLP) device.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures.

Figure 1:
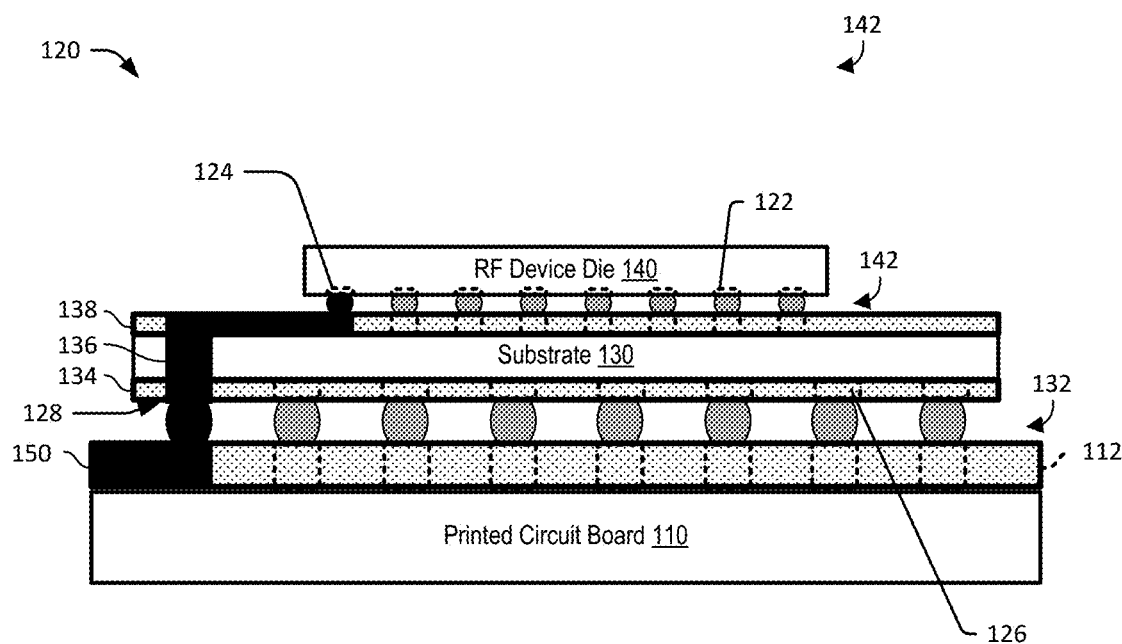
FIG. 1 illustrates a millimeter-wave system according to an embodiment of the current disclosure.

FIG. 1 illustrates a millimeter-wave system 100 including a printed circuit board (PCB) 110 and a radio frequency (RF) device 120. Millimeter-wave system 100 represents a manufactured electronic product, such as a cellular communication devices (e.g., a 5G smartphone), a millimeter-wave radio device, a military or civilian radar system, a security scanner, a medical imaging device. Millimeter-wave system 110 may include elements of the design that operate in the 30 to 300 gigahertz (GHz) frequency band. PCB 110 includes a top metallization layer 112 that includes patterned traces that provide the circuit interconnections between the components of millimeter-wave system 100, in accordance with a design of the millimeter-wave system. Hence, while top metallization layer 112 is depicted as a continuous layer, it will be understood that the top metallization layer is, in fact a patterned layer of metal material on the top surface of PCB 110. The metal material will typically be understood to be copper, but other materials may be utilized, such as gold, silver, platinum, or other conductive materials, as needed or desired. Top metallization layer 112 is further depicted as including various contact pads (dotted line boxes) for attaching RF device 112, and for providing electrical contacts between the RF device and PCB 110. Printed circuit board 110 may be understood to include one or more additional patterned metallization layers laminated between insulating layers that are interconnected with metallization vias. The insulating layers may include FR4 material in accordance with various PCB standards, polyamide or Teflon laminates, or other materials as needed or desired. The design and manufacture of PCBs is known in the art and will not be further described herein except as needed to illustrate the current embodiments. It will be further understood that the metal traces may be on the surface of PCB 110, such as microstrip traces, or may be between the insulating layers, such as stripline traces, as needed or desired.

RF device 120 includes a package substrate 130 and a RF device die 140. Package substrate 130 includes solder balls 132 affixed to contact pads 126 on a bottom metallization layer 134 and connected by one or more via 136 to a top metallization layer 138. Bottom and top metallization layers 134 and 134 are similar to top metallization layer 112 of PCB 110 in that top and bottom metallization layers 134 and 138 include patterned traces. However, here, the patterned traces and vias 136 that interconnect bottom metallization layer 134 and top metallization layer 138 provide the circuit interconnections between PCB 110 and RF device die 130 in accordance with a design of the RF device 120. Hence, while bottom and top metallization layers 134 and 138 are depicted as continuous layers, it will be understood that the bottom and top metallization layers are, in fact patterned layers of metal material on the bottom and top surfaces of substrate 130. The metal material will typically be understood to be copper, but other materials may be utilized, such as gold, silver, platinum, or other conductive materials, as needed or desired. Bottom and top metallization layers 134 and 138 are further depicted as including various contact pads (dotted line boxes) 126 for attaching substrate 130 to PCB 110 and including contact pads (dotted line boxes) for attaching RF device die 140 to substrate 130, and for providing electrical contacts between the RF device die 140 and the PCB 110. Substrate 130 may be understood to include one or more additional patterned metallization layers laminated between insulating layers that are interconnected with metallization vias. The insulating layers may include FR4 material in accordance with various PCB standards, polyamide or Teflon laminates, or other materials as needed or desired. The design and manufacture of substrates is known in the art and will not be further described herein except as needed to illustrate the current embodiments. It will be further understood that the metal traces may be on the surface of substrate 130, such as microstrip traces, or may be between the insulating layers, such as stripline traces, as needed or desired.

Solder balls 132 are applied to the contact pads 126 on bottom metallization layer 134 in the manufacturing process of RF device 120. When millimeter-wave system 100 is manufactured, RF device 120 is affixed to PCB 110 by applying heat sufficient to reflow solder balls 132 to make mechanical and electrical connections between the RF device 120 and the PCB 110. RF device die 140 includes solder bumps 142 that are applied to contact pads 122 at a surface of the RF device die 140 during a manufacturing process of the RF device die 140. Here, when RF device 120 is manufactured, RF device die 140 is affixed to substrate 130 by applying heat sufficient to reflow solder bumps 142 to make mechanical and electrical connections between the RF device die 140 and contact pads (dotted line boxes) of the top metallization layer 138 of the substrate 130. RF device 120 may be illustrative of various RF device packaging technologies, such as flip-chip device packaging, wire-bond packaging, embedded wafer level packaging (eWLB), fan out wafer level packaging (FOWLP), or the like, as needed or desired. The design and manufacture of RF devices 120, and the packaging thereof, is known in the art and will not be further described herein except as needed to illustrate the current embodiments.

RF device die 140 represents an integrated circuit device that includes one or more millimeter-wave circuits, and may include one or more other circuits that are not necessarily millimeter-wave circuits. For example, RF device die 140 may represent a mixed signal (analog and digital) integrated circuit, digital signal processing circuit, or the like, as needed or desired. RF device die 140 is characterized by the fact that signal contact pads 124 connected to one or more solder bumps 142 carry millimeter-wave signals. The millimeter-wave signals may include millimeter-wave signal inputs to RF device die 140, or millimeter-wave signal outputs from the RF device die. In a particular embodiment, RF device die 140 provides at least one of the millimeter-wave signals as a balanced pair, that is, where the millimeter-wave signal is provided on two adjacent solder bumps 142 (and associated signal contact pads 124) that carry a differential signal between the solder bumps. In this regard, millimeter-wave system 100 illustrates a RF circuit trace 150 (illustrated as black area) that may be understood to be connected via the signal contact pad 124 and blackened solder bump 142 to one or both of the balanced pair of millimeter-wave signals of RF device die 140. Here, the second one of the balanced pair of millimeter-wave signals may be understood to not be visible in the illustration of FIG. 1. RF circuit trace 150 is illustrated as being carried from the signal contact pad 124 of the RF device die 140 by one of the solder bumps 142 to a trace on top metallization layer 138, through via 136, to a signal contact pad 128 in bottom metallization layer 134, and through blackened solder ball 132 to a trace in top metallization layer 112. The trace in top metallization layer 112 will be understood to be routed to another component (not illustrated) of millimeter-wave system 100. RF circuit trace 150 may further be understood to traverse through one or more via similar to via 136 in substrate 130, through one or more additional metallization layers in the substrate 130, and through one or more additional metallization layers in printed circuit board 110, as needed or desired.

Figure 2:
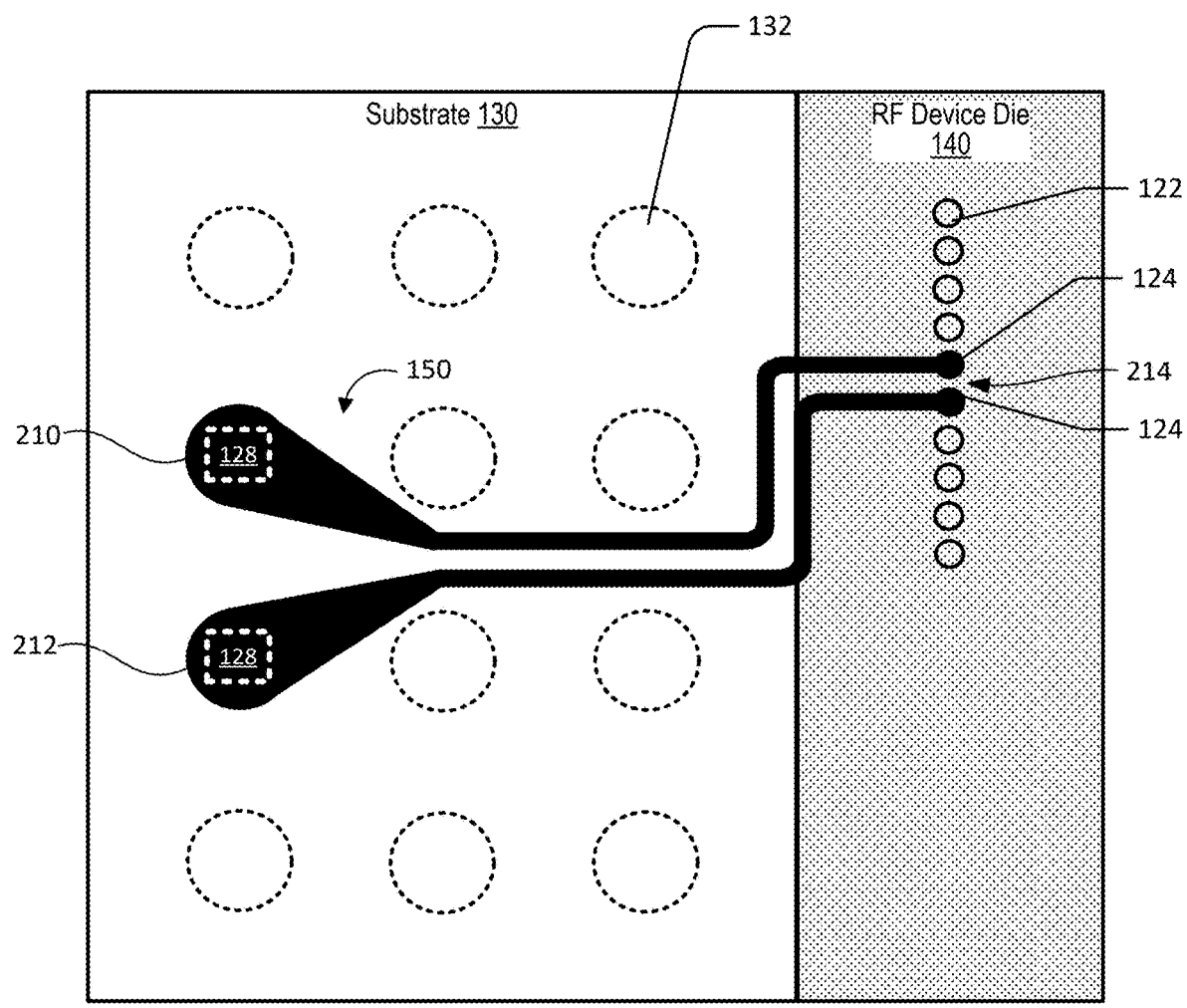
FIG. 2 illustrates a substrate of the millimeter-wave system of FIG. 1.

FIG. 2 illustrates substrate 130 including RF circuit trace 150. RF signal trace 150 is illustrated as a pair of traces 210 and 212 (circuit paths) that are routed on the top surface of substrate 130 to signal pads 123 (generally indicated at 214) that connect to the balanced pair of millimeter-wave signals from RF device die 140. Each of traces 210 and 212 (circuit paths) are configured to have substantially equal trace lengths from signal pads 214 to the associated solder balls on the bottom side of substrate 140. In particular, traces 210 and 212 will each have a length given as:

$$L = L_T + L_V \qquad \text{Equation 1;}$$

where L is the total length of each of traces 210 and 212 from the associated signal pad 214 to the associated solder ball 132, $L_T$ is the sum of the lengths of the traces traversed within the metallization layers of substrate 130, and $L_V$ is the sum of the lengths of the vias traversed within the substrate.

In a particular embodiment, traces 210 and 212 (circuit paths) are configured as a dual-mode matching network such that the millimeter-wave signal, as implemented on PCB 110, may be alternatively a balanced signal or a single-ended signal, as needed or desired. In particular, where the millimeter-wave signal on PCB 110 is implemented as a balanced signal, the millimeter-wave signal matches with the millimeter-wave signals as provided on RF device 120. That is, the millimeter-wave signal will have a low insertion loss because the millimeter-wave signal as provided on PCB 110 is a balanced and impedance matched signal like the millimeter-wave signal as utilized by RF device die 140. Moreover, where the millimeter-wave signal on PCB 110 is implemented as a single-ended signal, traces 210 and 212 act as a matching network, such that the single-ended signal on the PCB can be connected directly to RF device 120 without the need of an additional balun.

Figure 3:
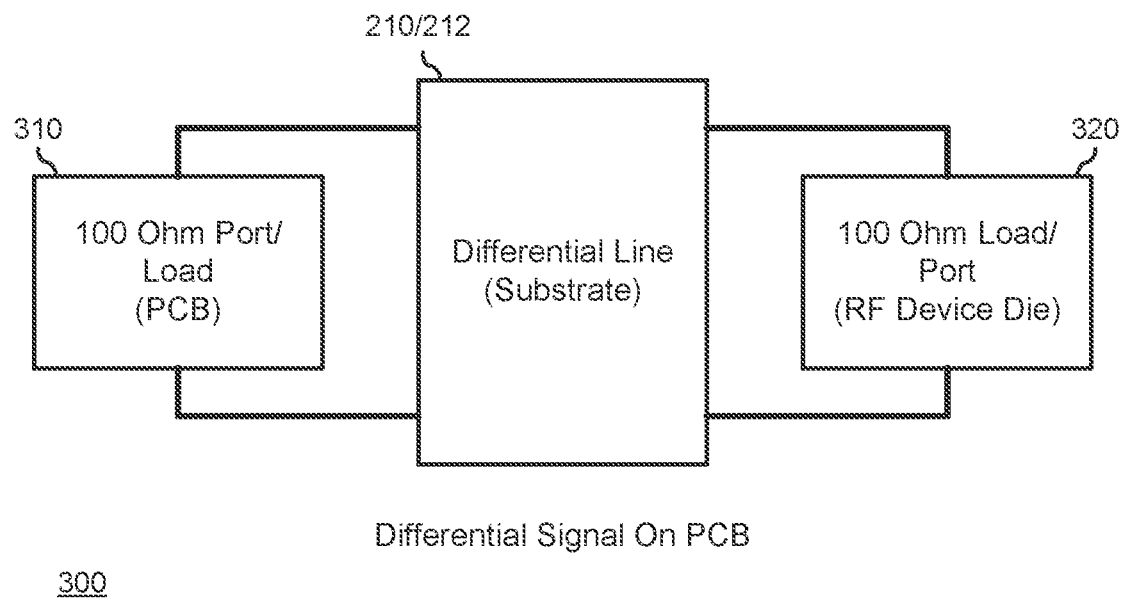
FIG. 3 is a block diagram illustrating connections of the millimeter-wave system of FIG. 1 according to various embodiments of the current disclosure.
Figure 3:
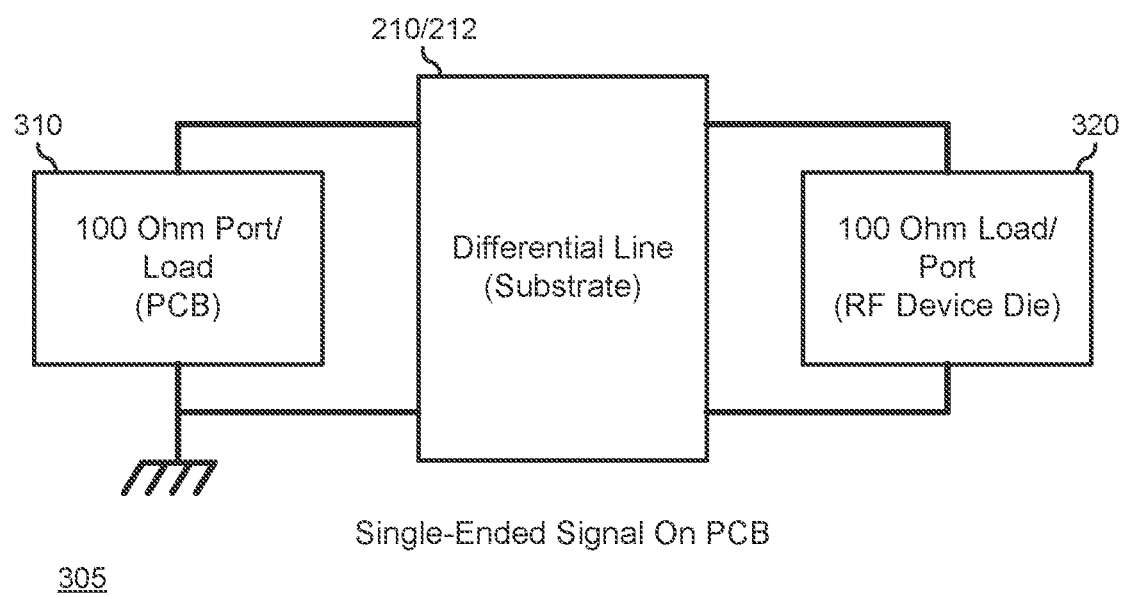

FIG. 3 illustrates block diagrams 300 and 305. In block diagram 300, a 100 Ohm element 310 on PCB 110 is shown as being connected via traces 210 and 212 to a 100 ohm element 320 of RF device die 140. Here, element 310 is configured as a balanced signal element. In block diagram 305, element 310 is again shown as being connected via traces 210 and 212 to element 320, where element 310 is configured as a single-ended signal element with one leg tied to a ground plane of PCB 110.

In this embodiment, traces 210 and 212 are designed with a length that is selected based upon an expected operating frequency of the associated millimeter-wave signal. In this regard, the length of traces 210 and 212 are designed to provide a half-wavelength matching network for the associated millimeter-wave signal, where the length is given as:

$$L = \lambda/0 \qquad \text{Equation 2;}$$

where λ is the wavelength. Here, it will be understood that the wavelength of a millimeter-wave signal will be given as:

$$\lambda = V/f \qquad \text{Equation 3;}$$

where v is the signal propagation speed, and f is the signal frequency. Further, where traces 210 and 212 represent microstrip traces, the signal propagation speed will be given by:

$$V_m = V_c/\sqrt{Er_{\mathit{eff}}} \qquad \text{Equation 4;}$$

where $V_m$ is the signal propagation speed, $V_c$ is the speed of light, and $Er_{\mathit{eff}}$ is the effective dielectric constant for a microstrip, and is given as:

$$Er_{\mathit{eff}} = 0.64 E_r + 0.36 \qquad \text{Equation 5;}$$

where $E_r$ is the dielectric constant of the insulating material of the substrate. Thus, for example, where the operating frequency of a millimeter-wave signal is expected to be 30

GHz, and the insulating material is a FR4 material with a dielectric constant of 4.0, then, using Equation 5:

$$Er_{eff}=0.64*4+0.36=2.92 \quad \text{Equation 6;}$$

and, substituting Equation 6 into Equation 4:

$$V_m=102.6\times10^6 \text{ m/s} \quad \text{Equation 7.}$$

Then, solving Equation 3 yields:

$$\lambda=5.8 \text{ millimeters (mm)} \quad \text{Equation 8.}$$

As such, the length of traces 210 and 212 should be designed to be 2.9 mm to create a half wave matching network for unbalanced signals. In another example, where the operating frequency of a millimeter-wave signal is expected to be 300 GHz, the wavelength will be determined to be 345 micrometers (um), and the length of traces 210 and 212 should be designed to be 172 um to create a half wave matching network for unbalanced signals.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An integrated circuit device, comprising:
    an integrated circuit device die having a plurality of first contact pads, the plurality of first contact pads including a pair of first signal contact pads configured to provide a differential signal port of the integrated circuit device die, the differential signal port configured to operate at a predetermined frequency; and
    a substrate having a plurality of second contact pads on a first surface of the substrate, the second contact pads configured to be soldered to a printed circuit board, the plurality of second contact pads including a pair of second signal contact pads, wherein the integrated circuit device die is affixed to a second surface of the substrate via the first contact pads, wherein the substrate includes a pair of circuit paths, each circuit path configured to couple one of the first signal contact pads to an associated one of the second signal contact pads, and wherein the pair of circuit paths is further configured to provide a half-wave matching network at the predetermined frequency to match a single-ended signal at the pair of second signal contact pads to the differential signal port.

2. The integrated circuit device of claim 1, wherein each circuit path includes a first circuit trace on a first metallization layer on the second surface of the substrate.

3. The integrated circuit device of claim 2, wherein each circuit path further includes a via coupling the first circuit trace on the second surface of the substrate to the associated second contact pad on the first surface of the substrate.

4. The integrated circuit device of claim 3, wherein the length includes a sum of a trace length of the first circuit trace and a via length of the via.

5. The integrated circuit device of claim 2, wherein each circuit path further includes a second circuit trace on a second metallization layer laminated within the substrate.

6. The integrated circuit device of claim 2, wherein the predetermined frequency is a millimeter-wave frequency in a range of 30 GHz to 300 GHz.

7. The integrated circuit device of claim 2, wherein the length is in a range between 2.9 millimeters and 172 millimeters.

8. The integrated circuit device of claim 2, wherein the integrated circuit device is one of a flip-chip device, an embedded wafer level packaging (eWLB) device, and a fan out wafer level packaging (FOWLP) device.

9. The integrated circuit device of claim 1, wherein the predetermined frequency is a millimeter-wave frequency in a range of 30 GHz to 300 GHz.

10. The integrated circuit device of claim 1, wherein the length is in a range between 2.9 millimeters and 172 millimeters.

11. The integrated circuit device of claim 1, wherein the integrated circuit device is one of a flip-chip device, an embedded wafer level packaging (eWLB) device, and a fan out wafer level packaging (FOWLP) device.

12. A method, comprising:
    providing, on an integrated circuit device die of an integrated circuit device, a plurality of first contact pads, the plurality of first contact pads including a pair of first signal contact pads configured to provide a differential signal port of the integrated circuit device die, the differential signal port configured to operate at a predetermined frequency;
    providing, on a substrate of the integrated circuit device, a plurality of second contact pads on a first surface of the substrate, the second contact pads configured to be soldered to a printed circuit board, the plurality of second contact pads including a pair of second signal contact pads;
    affixing the integrated circuit device die to a second surface of the substrate via the first contact pads; and
    providing, on the substrate, a pair of circuit paths, each circuit path configured to couple one of the first signal contact pads to an associated one of the second signal contact pads, wherein the pair of circuit paths is further configured to provide a half-wave matching network at the predetermined frequency to match a single-ended signal at the pair of second signal contact pads to the differential signal port.

13. The method of claim 12, further comprising:
    providing, in each circuit path, a first circuit trace on a first metallization layer on the second surface of the substrate.

14. The method of claim 13, further comprising:
    providing, in each circuit path, a via coupling the first circuit trace on the second surface of the substrate to the associated second contact pad on the first surface of the substrate.

15. The method of claim 14, further comprising:
    including a sum of a trace length of the first circuit trace and a via length of the via in the length.

16. The method of 13, further comprising:
 providing, in each circuit path further, a second circuit trace on a second metallization layer laminated within the substrate.

17. The method of claim 13, wherein at least one of: the predetermined frequency is a millimeter-wave frequency in a range of 30 GHz to 300 GHz, and the length is in a range between 2.9 millimeters and 172 millimeters.

18. The method of claim 13, wherein the integrated circuit device is one of a flip-chip device, an embedded wafer level packaging (eWLB) device, and a fan out wafer level packaging (FOWLP) device.

19. The method of claim 12, wherein at least one of: the predetermined frequency is a millimeter-wave frequency in a range of 30 GHz to 300 GHZ, and the length is in a range between 2.9 millimeters and 172 millimeters.

20. The method of claim 12, wherein the integrated circuit device is one of a flip-chip device, an embedded wafer level packaging (eWLB) device, and a fan out wafer level packaging (FOWLP) device.

\* \* \* \* \*